(12) United States Patent
Newman et al.

(10) Patent No.: US 8,736,319 B2
(45) Date of Patent: May 27, 2014

(54) POWER ON RESET CIRCUIT AND METHOD OF USE

(71) Applicant: Sand 9, Inc., Cambridge, MA (US)

(72) Inventors: Bruce M. Newman, Gilbert, AZ (US); Dean A. Badillo, Chandler, AZ (US); Reimund Rebel, Maricopa, AZ (US); Klaus Juergen Schoepf, Chandler, AZ (US); Mohammad Asmani, Ladera Ranch, CA (US)

(73) Assignee: Sand 9, Inc., Cambridge, MA (US)

( * ) Notice: Subject to any disclaimer, the term of this patent is extended or adjusted under 35 U.S.C. 154(b) by 0 days.

(21) Appl. No.: 13/788,955

(22) Filed: Mar. 7, 2013

(65) Prior Publication Data
US 2013/0187687 A1    Jul. 25, 2013

Related U.S. Application Data

(63) Continuation of application No. 13/281,921, filed on Oct. 26, 2011, now Pat. No. 8,415,993.

(51) Int. Cl.
*H03L 7/00* (2006.01)
*H03K 3/02* (2006.01)

(52) U.S. Cl.
USPC ............................ 327/142; 327/143; 327/198

(58) Field of Classification Search
USPC .................................. 327/142, 143, 546, 198
See application file for complete search history.

(56) References Cited

U.S. PATENT DOCUMENTS

| | | | |
|---|---|---|---|
| 4,716,322 A * | 12/1987 | D'Arrigo et al. | 327/143 |
| 5,003,196 A * | 3/1991 | Kawaguchi | 327/62 |
| 5,365,122 A | 11/1994 | Rackley | |
| 5,369,310 A * | 11/1994 | Badyal et al. | 327/143 |
| 5,446,404 A * | 8/1995 | Badyal et al. | 327/143 |
| 5,519,346 A | 5/1996 | Haddad et al. | |
| 5,818,271 A | 10/1998 | Stanojevic | |
| 5,818,286 A | 10/1998 | Watanabe | |
| 6,882,203 B2 | 4/2005 | Miyagi | |
| 7,301,374 B2 * | 11/2007 | Park | 327/77 |
| 7,375,563 B1 * | 5/2008 | Cheung et al. | 327/156 |
| 7,639,052 B2 | 12/2009 | Xiao | |
| 7,940,094 B2 | 5/2011 | Takeuchi | |
| 2006/0091924 A1 * | 5/2006 | Yamamoto et al. | 327/205 |
| 2007/0001720 A1 | 1/2007 | Li et al. | |
| 2007/0001721 A1 * | 1/2007 | Chen et al. | 327/143 |
| 2008/0238500 A1 | 10/2008 | Jung | |
| 2008/0272845 A1 | 11/2008 | Willassen et al. | |
| 2009/0002037 A1 * | 1/2009 | Ryoo | 327/143 |
| 2012/0256664 A1 * | 10/2012 | Gunther et al. | 327/143 |

\* cited by examiner

*Primary Examiner* — Lincoln Donovan
*Assistant Examiner* — Brandon S Cole
(74) *Attorney, Agent, or Firm* — Schmeiser, Olsen & Watts LLP

(57) ABSTRACT

The disclosed power-on reset circuit provides an indication of when and whether a supply voltage Vdd has reached a trigger voltage level Vtrig. The disclosed circuit includes a flip-flop circuit and a first comparator circuit. The circuit according to the invention has a D input node of the flip-flop circuit coupled to the supply voltage. The first comparator circuit outputs a clock signal, where the flip-flop circuit is clocked by the clock signal. A Q output node of the flip-flop circuit provides the power-on reset signal, where the power-on reset signal is in a LO state when the supply voltage is at a voltage level that is less than the trigger voltage level Vtrig. The power-on reset signal is in a HI state when the supply voltage is at a voltage level that is greater than the trigger voltage level Vtrig.

19 Claims, 6 Drawing Sheets

POWER ON RESET CIRCUIT AND METHOD OF USE

CROSS REFERENCE TO RELATED APPLICATIONS

This application claims the benefit under 35 U.S.C. §120 as a continuation of U.S. Utility Patent Application to Bruce M. Newman, et al, entitled "Power-On Reset Circuit and Method", Ser. No. 13/281,921, filed Oct. 26, 2011, the disclosure of which is hereby incorporated entirely herein by reference.

BACKGROUND OF THE INVENTION

1. Technical Field

This invention relates generally to electronic circuits and in particular to an electronic circuit that provides an indication of when a supply voltage has reached a particular voltage level, such as on start-up or reset.

2. State of the Art

Electronic circuits often require an indication of when a supply voltage has reached a specific voltage level after power-up or reset. After circuitry is turned on or reset, some parts of an electronic system may be kept dormant until the supply voltage reaches a certain level in order to restart circuitry or systems in a controlled and known manner. It is common to use a Power-On Reset (POR) circuit to provide an indication of when a supply voltage has reached a certain level. In systems containing digital circuitry, POR circuits are used to provide a power-on reset signal indication, in the form of a voltage transition, of when the supply voltage reaches a certain predetermined voltage level. The signal indication is used to place digital logic in a known state when the supply voltage is initially applied to the system.

Issues can arise, however, related to the fact that the amount of time it takes the supply voltage to reach its final value can vary greatly depending on the application. The specifications for some electronic systems are defined relative to when a supply voltage settles to its final value. For example, oscillator start-up times may be defined as settling to within a certain value within a specific time after the supply voltage reaches its maximum voltage value. In these cases, it is desirable to have the supply voltage level that triggers the transition of the power-on reset signal to be just slightly below the supply voltage maximum value, so that the time interval between the supply voltage reaching the trigger value and the supply voltage reaching its maximum value is minimally affected by the rate at which the supply voltage rises to its maximum value. It is also desirable to have the voltage level of the trigger voltage be insensitive to circuit process and temperature variations. In addition, it is desirable for fluctuations and/or perturbations of the voltage level of the supply voltage to not cause the power-on reset signal to transition. These two requirements have been mutually exclusive in many POR circuits because setting the trigger voltage close to the maximum supply voltage value can result in false triggering of the power-on reset signal when the supply voltage fluctuates below the trigger voltage level. Thus it is desirable to have a POR circuit that provides an indication of when a supply voltage reaches a predetermined trigger voltage level, to have this trigger voltage level be insensitive to process and temperature variations, and to have the capability to set the trigger voltage level asymptotically close to the maximum value of the supply voltage.

DISCLOSURE OF THE INVENTION

The present invention relates to electronic circuits and in particular to an electronic circuit that provides an indication of when a supply voltage has reached a particular voltage level, such as on start-up or reset.

Disclosed is an electronic circuit for generating a reset signal. The electronic circuit according to the invention includes a flip-flop circuit and a clock comparator circuit. A clock comparator circuit output node is coupled to a clock input node of the flip-flop circuit. In some embodiments an inverting input node of the clock comparator circuit is coupled to a bandgap voltage reference circuit. In some embodiments the inverting input node of the clock comparator circuit is coupled to the bandgap voltage reference circuit through an attenuator circuit. In some embodiments a non-inverting input node of the clock comparator circuit is coupled to a voltage divider circuit. In some embodiments a D input node of the flip-flop circuit is coupled to a supply voltage. In some embodiments the voltage divider circuit outputs a divided voltage signal from a voltage divider circuit output node, where the divided voltage signal is linearly proportion to the voltage level of the supply voltage, and where the voltage divider circuit output node is coupled to the non-inverting input node of the clock comparator circuit. In some embodiments a reset node of the flip-flop circuit is coupled to an enable comparator circuit. In some embodiments an enable comparator circuit output node outputs an enable signal, where the clock comparator circuit is enabled by the enable signal. In some embodiments a Q output node of the flip-flop circuit outputs the reset signal.

Disclosed is an electronic circuit for indicating whether a supply voltage has reached a predetermined supply voltage level after power start-up or reset. The electronic circuit according to the invention includes a flip-flop circuit and an enable comparator circuit. The flip-flop circuit generates a power-on reset signal where the power-on reset signal indicates whether the supply voltage has reached the predetermined supply voltage level. An enable comparator circuit output node of the enable comparator circuit is coupled to a reset node of the flip-flop circuit. In some embodiments the circuit according to the invention includes a clock comparator circuit, where a clock comparator circuit output node of the clock comparator circuit is coupled to a clock node of the flip-flop circuit. In some embodiments a D input node of the flip-flop circuit is coupled to the supply voltage. In some embodiments the enable comparator circuit receives power from the supply voltage. In some embodiments the clock comparator circuit receives power from the supply voltage.

Disclosed is an electronic circuit that includes a flip-flop circuit and a first comparator circuit. The circuit according to the invention has a D input node of the flip-flop circuit coupled to a supply voltage. The first comparator circuit outputs a clock signal, where the flip-flop circuit is clocked by the clock signal. A Q output node of the flip-flop circuit provides a power-on reset signal, where the power-on reset signal is in a LO state when the supply voltage is at a voltage level that is less than a first predetermined supply voltage level.

In some embodiments the circuit includes a second comparator circuit, where the second comparator circuit outputs an enable signal, and where the enable signal resets the flip-flop circuit. In some embodiments the enable signal enables the first comparator circuit. In some embodiments the enable signal is in a LO state when the supply voltage is at a voltage level that is less than a second predetermined supply voltage level, and the enable signal is in a HI state when the supply voltage is at a voltage level that is greater than or equal to the second predetermined supply voltage level. The second predetermined supply voltage level is less than the first predetermined supply voltage level. In some embodiments the clock signal is in a LO state when the supply voltage level is at a voltage level that is both greater than a third predetermined supply voltage level and less than the first predetermined supply voltage level, where the third predetermined supply voltage level is less than the second predetermined supply voltage level.

Disclosed is a method of indicating that a voltage level of a supply voltage has reached a first predetermined supply voltage level. The method according to the invention includes the steps of coupling a D input node of a flip-flop circuit to the supply voltage, and clocking the flip-flop circuit with a clock signal, where the clock signal is generated by a first comparator circuit. The method according to the invention also includes the steps of resetting the flip-flop circuit with an enable signal, where the enable signal is generated by a second comparator circuit, and providing an output signal of the flip-flop circuit as an indication that the voltage level of the supply voltage has reached the first predetermined supply voltage level.

In some embodiments the first comparator circuit is enabled by the enable signal. In some embodiments an output signal provided from a Q output node of the flip-flop circuit is used to indicate that the voltage level of the supply voltage has reached the first predetermined supply voltage level. In some embodiments resetting the flip-flop circuit with an enable signal includes the step of maintaining an enable signal in a LO state if the voltage level of the supply voltage is less than a second predetermined supply voltage level, where an output signal provided from a Q output node of the flip-flop circuit is in a LO state when the enable signal is in a LO state, and where the second predetermined supply voltage level is less than the first predetermined supply voltage level. In some embodiments resetting the flip-flop circuit with an enable signal includes the step of providing the enable signal to a reset node of the flip-flop circuit.

In some embodiments of the method according to the invention, clocking the flip-flop circuit with a clock signal comprises maintaining a clock signal in a LO state if the voltage level of the supply voltage is within a range of voltage levels that varies from a third predetermined supply voltage level to the first predetermined supply voltage level, where an output signal provided from a Q output node of the flip-flop circuit is in a LO state when the clock signal is in a LO state, and where the third predetermined supply voltage level is less than the second predetermined supply voltage level. In some embodiments of the method, clocking the flip-flop circuit with a clock signal comprises providing the clock signal to a clock input node of the flip-flop circuit.

Disclosed is a method of generating a power-on reset signal, where the power-on reset signal indicates when a voltage level of a supply voltage has reached a first predetermined supply voltage level. The method according to the invention includes the step of holding a flip-flop circuit in a reset mode when the voltage level of the supply voltage is less than a second predetermined supply voltage level, where an output signal provided from a Q output node of the flip-flop circuit is in a LO state when the flip-flop circuit is in the reset mode, and where the second predetermined supply voltage level is less than the first predetermined supply voltage level. The method according to the invention also includes the step of clocking the flip-flop circuit with a clock signal, where the clock signal is in a LO state when the voltage level of the supply voltage is within a range of voltage levels that varies from a third predetermined supply voltage level to the first predetermined supply voltage level, and wherein the clock signal is in a HI state when the supply voltage level is greater than or equal to the first predetermined supply voltage level, and wherein the third predetermined supply voltage level is less than the second predetermined supply voltage level, and where the output signal provided from the Q output node of the flip-flop circuit is in a LO state when the clock signal is in a LO state. The method according to the invention also includes the step of providing the signal output from the Q output node of the flip-flop circuit as a power-on reset signal.

In some embodiments of the method according to the invention, clocking the flip-flop circuit with a clock signal includes the steps of generating a clock signal with a first comparator circuit, and providing the clock signal to a clock input node of the flip-flop circuit. In some embodiments generating a clock signal with a first comparator circuit includes the step of providing a divided voltage signal to a non-inverting input node of the first comparator circuit, where the voltage level of the divided voltage signal varies proportionally to the voltage level of the supply voltage. In some embodiments generating a clock signal with a first comparator circuit includes the step of providing a bandgap reference voltage to an inverting input node of the first comparator circuit, where the voltage level of the divided voltage signal is less than the voltage level of the bandgap reference voltage when the voltage level of the supply voltage is within a range of supply voltage levels that varies from a third predetermined supply voltage level to the first predetermined supply voltage level, and where the voltage level of the divided voltage signal is greater than the voltage level of the bandgap reference voltage when the voltage level of the supply voltage is greater than or equal to the first predetermined supply voltage level. In some embodiments generating a clock signal with a first comparator circuit includes the step of using an output signal from the clock comparator circuit as a clock signal.

In some embodiments of the method according to the invention, holding a flip-flop circuit in a reset mode when the voltage level of the supply voltage is less than a second predetermined supply voltage level includes the step of generating an enable signal with a second comparator circuit, where the enable signal is in a LO state when the voltage level of the supply voltage is less than a second predetermined supply voltage level, and wherein the enable signal is in a HI state when the voltage level of the supply voltage is greater than or equal to the second predetermined supply voltage level. In some embodiments of the method according to the invention, holding a flip-flop circuit in a reset mode when the voltage level of the supply voltage is less than a second predetermined supply voltage level includes the step of providing the enable signal to a reset node of the flip-flop circuit, where the flip-flop circuit is in the reset mode when the enable signal is in a LO state.

The foregoing and other features and advantages of the present invention will be apparent from the following more detailed description of the particular embodiments of the invention, as illustrated in the accompanying drawings.

DETAILED DESCRIPTION OF EMBODIMENTS OF THE INVENTION

Figure 1:
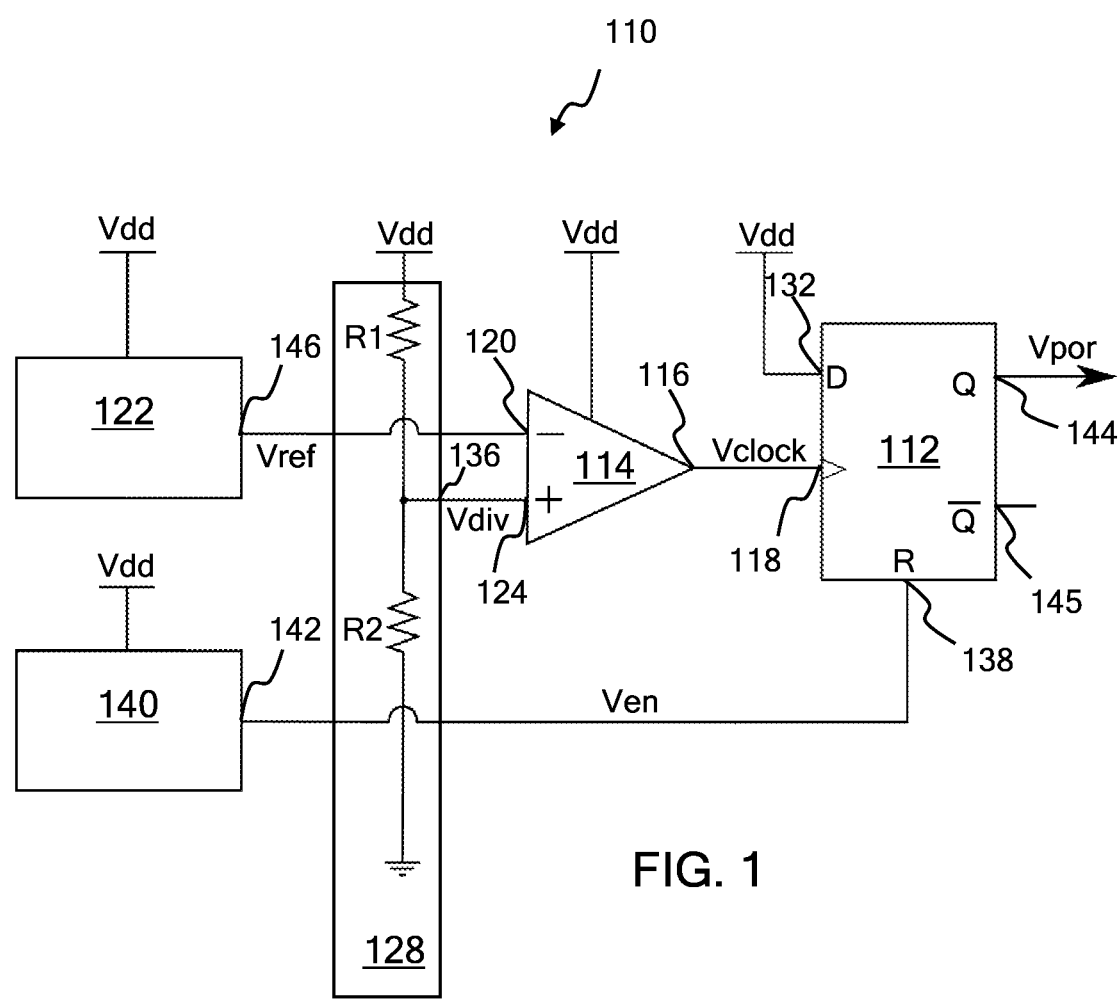
FIG. 1 shows a block diagram of one embodiment of circuit 110 according to the invention.

As discussed above, embodiments of the present invention relate to electronic circuits, and in particular to an electronic circuit that provides an indication of when and/or whether a supply voltage has reached a particular voltage level, such as on start-up or reset. These circuits, often called power-on reset (POR) circuits, are in common use with electronic systems that include digital circuitry. POR circuits are used to place digital logic in a known state when the supply voltage Vdd is applied to the system. POR circuits provide a signal indication, often in the form of a voltage transition, once the voltage level of a supply voltage Vdd reaches a trigger voltage level Vtrig, where trigger voltage level Vtrig is a voltage level less than or equal to the maximum supply voltage level Vdd (max). Trigger voltage level Vtrig is the voltage level that triggers the POR circuit to provide the signal indication. Issues can occur because the rate at which the voltage level of supply voltage Vdd rises to its maximum level can vary widely from application to application, and yet some system specifications are defined relative to the time that the voltage level of supply voltage Vdd settles to its final voltage level. It is desirable to have trigger voltage level Vtrig be a voltage level as close as possible to maximum supply voltage level Vdd(max), so that the time difference between when supply voltage Vdd reaches trigger voltage level Vtrig and when supply voltage Vdd reaches its maximum voltage value Vdd (max) is as small as possible. However, it is also desirable to have a power-on reset signal that will not trigger due to fluctuations or perturbations of the voltage level of the supply voltage Vdd.

The disclosed circuit provides an indication of when and whether a supply voltage Vdd has reached a trigger voltage level Vtrig, called first predetermined supply voltage level Vtrig in this document. The disclosed circuit provides this indication in the form of a power-on reset signal Vpor (also referred to as reset signal Vpor) that transitions from one voltage level to another when the voltage level of supply voltage Vdd reaches first predetermined supply voltage level Vtrig. The disclosed circuit can be used for many purposes. The disclosed circuit generates a reset signal Vpor that can be used to indicate when the voltage level of supply voltage Vdd reaches first predetermined supply voltage level Vtrig. Reset signal Vpor can be used to indicate whether the voltage level of supply voltage Vdd has reached the first predetermined supply voltage level Vtrig. Reset signal Vpor can be used to indicate when supply voltage Vdd reaches first predetermined supply voltage level Vtrig after power start-up or reset of an electronic system. The disclosed circuit generates reset signal Vpor that can be used for other purposes. Reset signal Vpor can be used to provide an indication of when, if, or whether any type of signal reaches a predetermined voltage level. The disclosed circuit can be used to generate a signal indication that is used to indicate when any type of signal reaches a predetermined signal level.

The disclosed circuit generates reset signal Vpor that indicates when the voltage level of supply voltage Vdd reaches first predetermined supply voltage level Vtrig, where Vtrig can be set to be asymptotically close to the maximum voltage level Vdd(max) of supply voltage Vdd. Reset signal Vpor generated by the disclosed circuit will not trigger falsely if the voltage level of supply voltage Vdd fluctuates to a voltage level below first predetermined supply voltage level Vtrig. In addition, first predetermined supply voltage level Vtrig will not vary due to process or temperature variations of the disclosed circuit.

Figure 2:
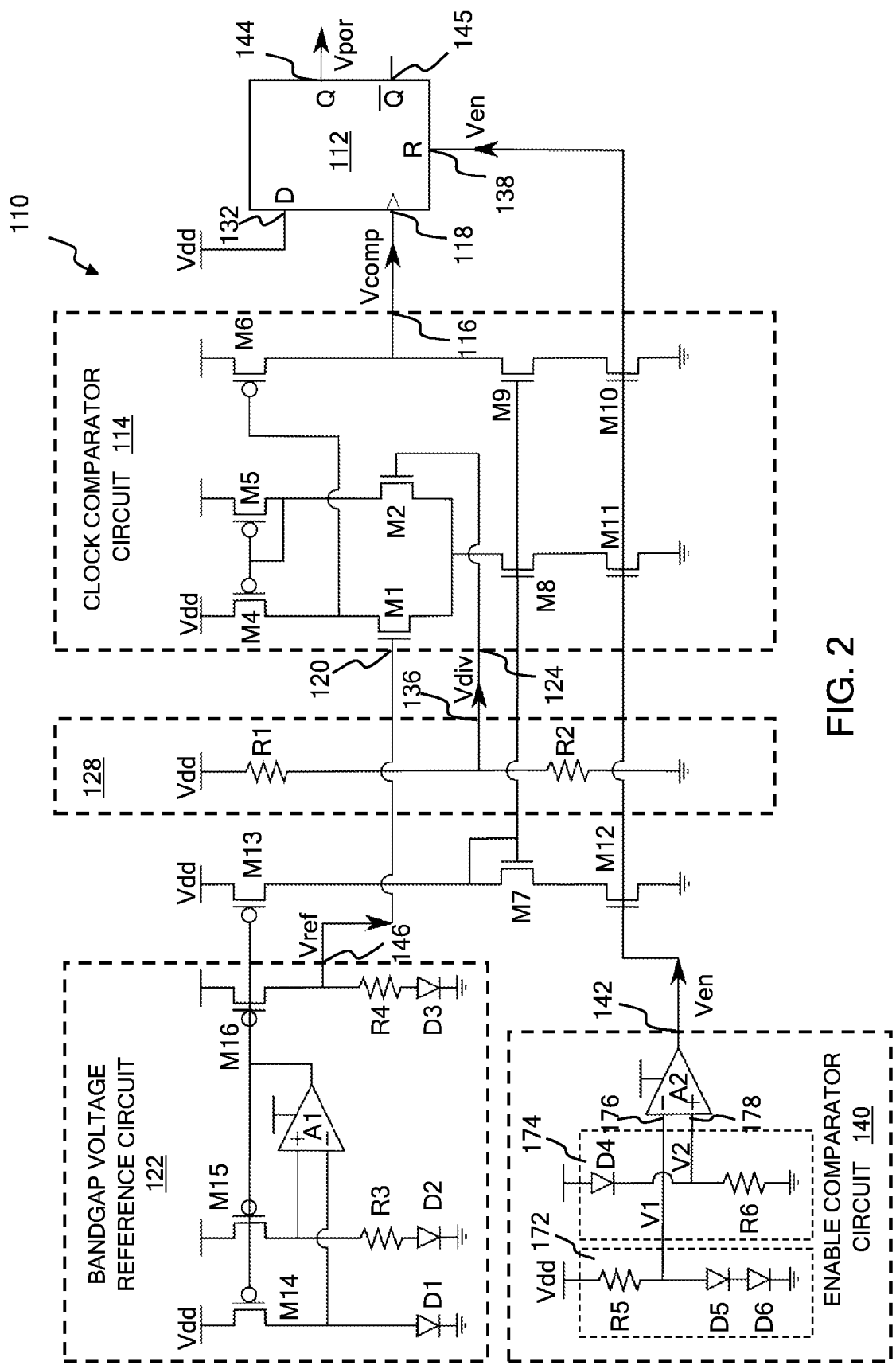
FIG. 2 shows one possible schematic embodiment of circuit 110 of FIG. 1.
Figure 3:
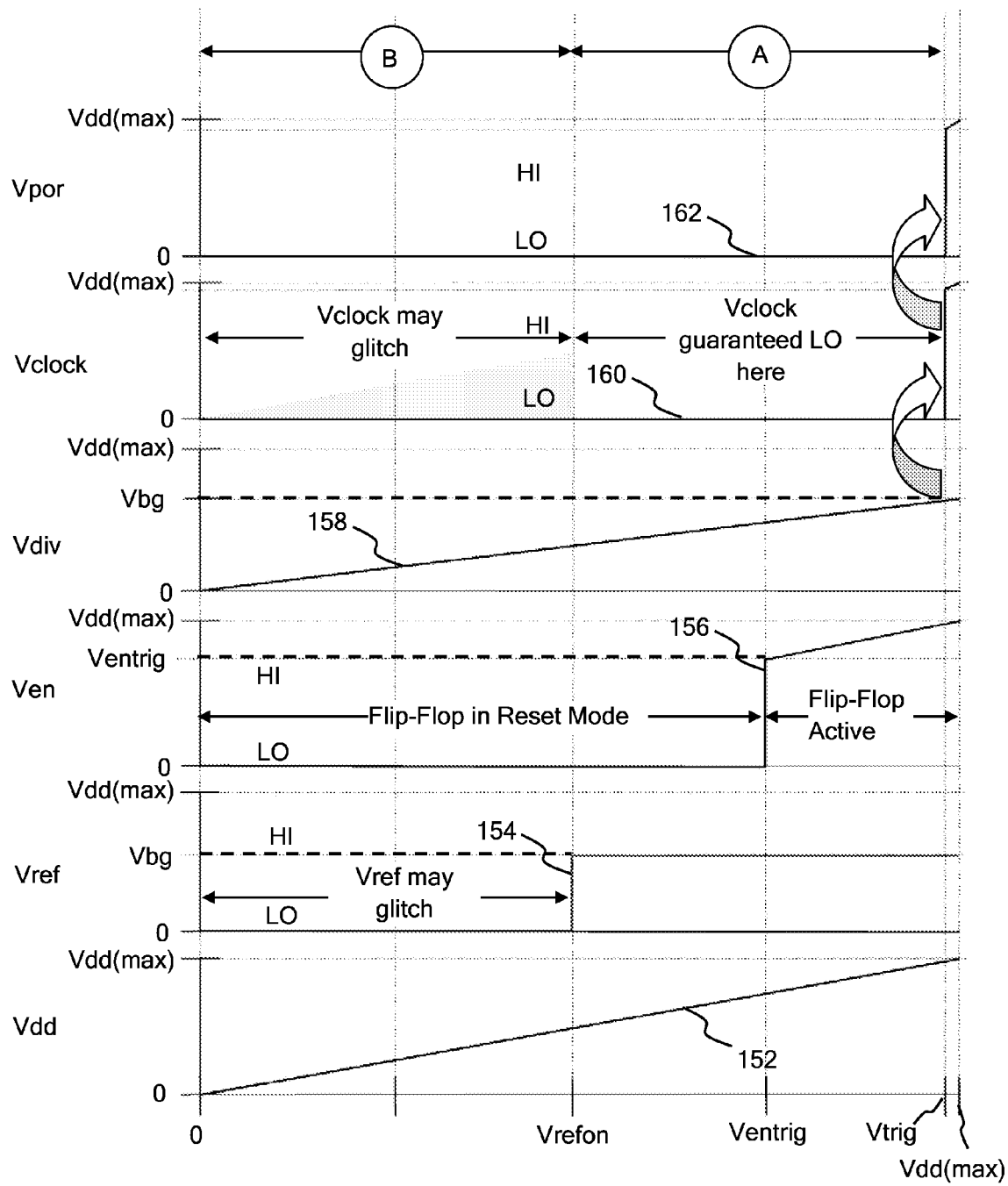
FIG. 3 illustrates a timing diagram showing several signal traces and signal transitions for circuit 110 of FIG. 2 and FIG. 3.

FIG. 1 shows a block diagram of one embodiment of circuit 110 according to the invention. FIG. 2 shows one possible schematic embodiment of circuit 110 of FIG. 1. FIG. 3 shows signal level vs. voltage traces for some of the signals used by and generated by circuit 110 of FIG. 1 and FIG. 2. In this embodiment circuit 110 is used to generate power-on reset signal Vpor. Power-on reset signal Vpor is used as an indication that the voltage level of supply voltage Vdd has reached first predetermined supply voltage level Vtrig. Power-on reset signal Vpor (also called reset signal Vpor) being used as an indication that supply voltage Vdd has reached first predetermined supply voltage level Vtrig means that power-on reset signal Vpor can be used as an indication of either when or whether the voltage level of supply voltage Vdd has reached first predetermined supply voltage level Vtrig. First predetermined supply voltage level Vtrig in this embodiment can be set to be asymptotically close to maximum supply voltage level Vdd(max), without causing reset signal Vpor to falsely trigger due to fluctuations, glitches, or other variations in the voltage level of supply voltage Vdd. Circuit 110 according to the invention and reset signal Vpor can be used for any application that can benefit from an output signal that provides an indication in response to an input signal reaching a predetermined voltage level.

Circuit 110 in the embodiment shown in FIG. 1 and FIG. 2 includes flip-flop circuit 112. Flip-flop circuit 112 generates reset signal Vpor. In some embodiments power-on reset signal Vpor is used to indicate whether the voltage level of supply voltage Vdd has reached first predetermined supply voltage level Vtrig. In some embodiments power-on reset signal Vpor is used to indicate when the voltage level of supply voltage Vdd has reached first predetermined supply voltage level Vtrig. In the embodiment shown in FIG. 1 and FIG. 2, power-on reset signal Vpor is output by Q output node 144 of flip-flop circuit 112, but the invention is not limited in this aspect. In some embodiments power-on reset signal Vpor is generated by not-Q node 145 of flip-flop circuit 112. In the embodiment shown in FIG. 1, D input node 132 of flip-flop circuit 112 is coupled to supply voltage Vdd. In the embodiment shown in FIG. 1 and FIG. 2, flip-flop circuit 112 is a D flip-flop circuit. The disclosed circuit is not limited in this aspect, as flip-flop circuit 112 can be many different types of flip-flop circuits. In some embodiments flip-flop circuit 112 is an S-R flip-flop circuit, with clock signal Vclock coupled to the S input node, and enable signal Ven coupled to the R input node.

Circuit 110 of FIG. 1 and FIG. 2 also includes first comparator circuit 114, also called clock comparator circuit 114 because in this example first comparator circuit 114 is providing clock signal Vclock to clock input node 118 of flip-flop circuit 112. Clock signal Vclock is output by clock comparator circuit output node 116 as shown in FIG. 1. Clock comparator circuit output node 116 is coupled to clock input node 118 of flip-flop circuit 112 in this embodiment. Flip-flop circuit 112 is clocked by clock signal Vclock. Flip-flop circuit 112 being clocked by clock signal Vclock means that clock signal Vclock is received by clock input node 118. In this embodiment clock comparator circuit 114 is receiving power from supply voltage Vdd.

Clock comparator circuit 114 includes inverting input node 120 and non-inverting input node 124. In this embodiment inverting input node 120 is coupled to bandgap voltage reference circuit 122. Bandgap voltage reference circuit 122 delivers reference voltage signal Vref to inverting input node 120 of clock comparator circuit 114.

FIG. 3 includes traces showing signal output voltage levels vs. the voltage level of supply voltage Vdd for several signals of circuit 110 of FIG. 1 and FIG. 2. Trace 152 shows a plot of the voltage level of supply voltage Vdd along both the X and Y axes, from zero to maximum supply voltage level Vdd (max). The Y axis is compressed as compared to the X axis so multiple traces can be shown vertically for ease of comparison. Traces 154, 156, 158, 160 and 162 show signal voltage levels along the vertical (Y) axis, and the voltage level of supply voltage Vdd along the horizontal (X) axis. These graphs show how the signal voltage level of the plotted signals of circuit 110 vary with the voltage level of supply voltage Vdd, as the voltage level of supply voltage Vdd increases from zero to its maximum value Vdd(max). The voltage level of supply voltage Vdd can be increasing from zero to its maximum value for any number of reasons, including a system power-on sequence, or after a power outage or power reset. Trace 154 shows the behavior of reference voltage signal Vref vs. the voltage level of supply voltage Vdd. Trace 156 shows the behavior of enable signal Ven vs. the voltage level of supply voltage Vdd. Trace 158 shows the behavior of divided voltage signal Vdiv vs. the voltage level of supply voltage Vdd. Trace 160 shows the behavior of clock signal Vclock vs. the voltage level of supply voltage Vdd. Trace 162 shows the behavior of power-on reset signal Vpor vs. the voltage level of supply voltage Vdd.

Several signals shown in FIG. 3 are indicated as having two states, a LO voltage state and a HI voltage state. These LO and HI voltage states are used in their usual meaning as is known in the art for dual-state signals. A LO state is often used to designate the signal state with the lowest voltage, but the invention is not limited in this aspect. In the embodiment of circuit 110 shown in FIG. 1, FIG. 2, and FIG. 3, the LO state is used to designate the state of the signal when the voltage level is at zero volts. In the embodiment of circuit 110 shown in FIG. 1, FIG. 2, and FIG. 3, the HI state is used to designate the state of the signal when the voltage level is at or above a specific voltage level that is greater than zero volts. It is to be understood that these are specific examples and many other particular voltage levels are possible for the LO and HI voltage states of circuit 110 according to the invention signals.

The rise of the voltage level of supply voltage Vdd from zero volts to maximum supply voltage level Vdd(max) is shown as curve 152 in FIG. 3. Three intermediate predetermined supply voltage levels are shown. First predetermined supply voltage level Vtrig is the voltage level of supply voltage Vdd that triggers power-on reset signal Vpor to transition from a LO state to a HI state, as shown in FIG. 3. Second predetermined supply voltage level Ventrig is the voltage level of supply voltage Vdd that triggers enable signal Ven to transition from a LO state to a HI state, as shown in FIG. 3. Third predetermined supply voltage level Vrefon is the voltage level of supply voltage Vdd that triggers reference voltage signal Vref to transition from a LO state to a HI state, as shown in FIG. 3. In circuit 110 according to the invention, first predetermined supply voltage level Vtrig is greater than second predetermined supply voltage level Ventrig. In circuit 110 according to the invention, second predetermined supply voltage level Ventrig is greater than third predetermined supply voltage level Vrefon.

Bandgap voltage reference circuit 122 generates bandgap reference voltage signal Vref. Reference voltage signal Vref is used by clock comparator circuit 114. Reference voltage signal Vref is output from bandgap voltage reference circuit output node 146, and is received by inverting input node 120 of clock comparator circuit 114 in the embodiment of circuit 110 of FIG. 1 and FIG. 2.

In the embodiment shown in FIG. 1 and FIG. 2, bandgap voltage reference circuit 122 receives power from supply voltage Vdd. Bandgap voltage reference circuit 122 is designed in this embodiment to output voltage reference signal Vref which has a voltage level that is equal to a typical semiconductor bandgap voltage level Vbg, whenever the voltage level of supply voltage Vdd exceeds bandgap voltage level Vbg by a voltage level Von. Voltage level Von is the amount of voltage that supply voltage Vdd needs to increase above bandgap voltage Vbg for bandgap voltage reference circuit 122 to stabilize voltage reference signal Vref at a voltage level equal to bandgap voltage level Vbg. Thus, third predetermined supply voltage level Vrefon=Vbg+Von is the supply voltage level where voltage reference signal Vref transitions to a stable output voltage level of Vref=Vbg as supply voltage Vdd increases from zero, as shown by curve 152 and 154 in FIG. 3. As the voltage level of supply voltage Vdd increases from zero to its maximum supply voltage value Vdd(max), such as at power start-up or a system reset, bandgap voltage reference circuit 122 outputs voltage reference signal Vref, where Vref=Vbg, whenever the voltage level of supply voltage Vdd is greater than or equal to third predetermined supply voltage level Vrefon, where Vrefon=Vbg+Von. Bandgap voltage reference circuit 122 is designed such that voltage reference signal Vref is stable at bandgap voltage level Vbg when the voltage level of supply voltage Vdd is greater than or equal to third predetermined supply voltage level Vrefon. Third predetermined supply voltage level Vrefon is less than first predetermined voltage level Vtrig in circuit 110 according to the invention. This section of stable output of Vref is shown as supply voltage range A in FIG. 3.

When the voltage level of supply voltage Vdd is at a voltage level less than third predetermined voltage level Vrefon, Vref is shown to be at zero volts, but in practice bandgap voltage reference circuit 122 may not be completely stable at these low levels of supply voltage Vdd. When the voltage level of supply voltage Vdd is at a voltage level less than third predetermined voltage level Vrefon, voltage reference signal Vref may transition unexpectedly (glitch) and trigger an unexpected transition of Vclock, the output of clock comparator 114. This section of possible unstable output of voltage reference signal Vref and clock signal Vclock is shown as section B in FIG. 3. This lack of stability of voltage reference signal Vref and clock signal Vclock during supply voltage Vdd range B, when the voltage level of supply voltage Vdd is at a voltage level less than third predetermined voltage level Vrefon, is handled by enable comparator circuit 140, as will be explained shortly.

Figure 4:
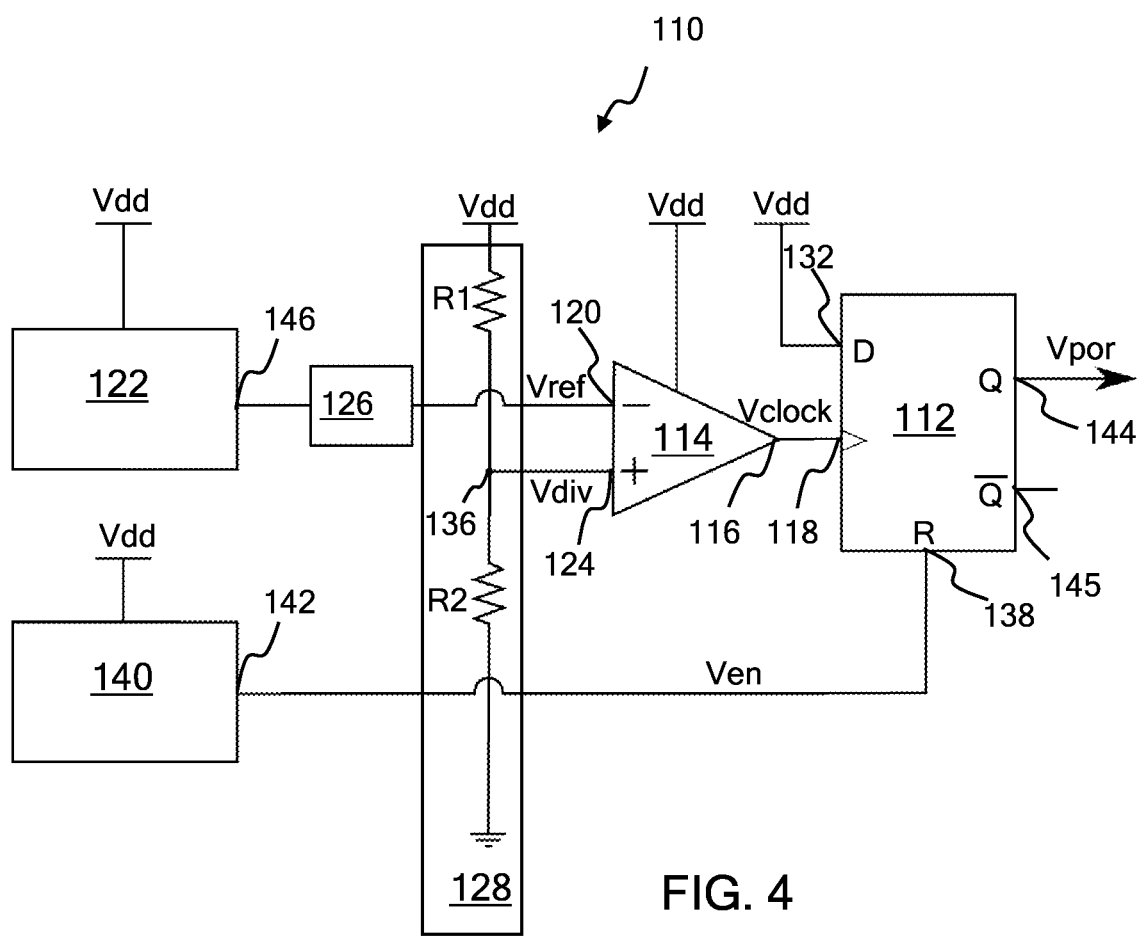
FIG. 4 shows a block diagram of another embodiment of circuit 110 according to the invention.

In some embodiments voltage reference signal Vref is generated using other means, methods, or circuits. In some embodiments of circuit 110 according to the invention, a voltage reference circuit is used to generate a voltage reference signal Vref that has a HI state voltage level greater than bandgap voltage level Vbg. In some embodiments of circuit 110 according to the invention, a voltage reference circuit is used to generate a voltage reference signal Vref that has a HI state voltage level less than bandgap voltage level Vbg. FIG. 4 shows a block diagram of another embodiment of circuit 110 according to the invention, where inverting input node 120 of clock comparator circuit 114 is coupled to bandgap voltage reference circuit output node 146 through attenuator 126. The embodiment of circuit 110 shown in FIG. 4 allows the HI state voltage level of reference voltage signal Vref to be lower than a typical semiconductor bandgap voltage. In circuit 110 according to the invention, any type of reference voltage generator circuit can be used to supply voltage reference signal Vref to clock comparator circuit 114.

Clock comparator circuit 114 includes inverting input node 120 and non-inverting input node 124. In this embodiment non-inverting input node 124 is coupled to voltage divider circuit 128. Voltage divider circuit 128 provides divided voltage signal Vdiv to non-inverting input node 124 of clock comparator circuit 114. Divided voltage signal Vdiv is provided as output from voltage divider circuit 128 at voltage divider circuit output node 136. Voltage divider circuit output node 136 is electrically coupled to non-inverting input node 124 of clock comparator circuit 114.

The voltage level of divided voltage signal Vdiv varies proportionally to the voltage level of supply voltage Vdd according to the equation $$Vdiv = Vdd * \left(\frac{R2}{R1 + R2}\right), \quad (1)$$

where Vdiv is the voltage level of divided voltage signal Vdiv, Vdd is the voltage level of supply voltage Vdd, R1 is the resistance value of resistor R1, and R2 is the resistance value of resistor R2. Curve 158 of FIG. 3 shows how divided voltage signal Vdiv varies proportionally to supply voltage Vdd as the voltage level of supply voltage Vdd rises from zero volts to maximum supply voltage level Vdd(max). In circuit 110 according to the invention, R1 and R2 are chosen such that divided voltage signal Vdiv is equal to bandgap voltage level Vbg when the voltage level of supply voltage Vdd is equal to first predetermined supply voltage level Vtrig. Thus when the voltage level of supply voltage Vdd reaches first predetermined supply voltage level Vtrig, divided voltage signal Vdiv received at non-inverting input node 124 of clock comparator circuit 114 becomes greater than or equal to bandgap voltage Vbg received at inverting input node 120 of clock comparator circuit 114, which causes clock signal Vclock output from clock comparator circuit output node 116 to transition from a LO state to a HI state, as shown in FIG. 3. Clock signal Vclock transitioning from a LO state to a HI state causes flip-flop circuit 112 to transition reset signal Vpor from a LO state to a HI state, as long as flip-flop circuit 112 is not held in reset mode by enable signal Ven. In circuit 110 according to the invention, clock signal Vclock is in a LO state when supply voltage Vdd is at a voltage level that is both greater than third predetermined supply voltage level Vrefon and less than first predetermined supply voltage level Vtrig. In circuit 110 according to the invention, clock signal Vclock is in a HI state when supply voltage Vdd is at a voltage level that is greater than or equal to first predetermined supply voltage level Vtrig.

Circuit 110 of FIG. 1 and FIG. 2 includes second comparator circuit 140. Second comparator circuit 140 is also called enable comparator circuit 140 because in this example second comparator circuit 140 generates enable signal Ven. Flip-flop circuit 112 is coupled to enable comparator circuit 140. Enable comparator circuit output node 142 of enable comparator circuit 140 is coupled to reset node 138 of flip-flop circuit 112. Enable comparator circuit output node 142 outputs enable signal Ven, which is delivered to reset node 138 of flip-flop circuit 112. Enable signal Ven resets flip-flop circuit 112 because enable signal Ven is received by reset node 138 of flip-flop circuit 112.

In the embodiment of enable comparator circuit 140 shown in FIG. 2, enable comparator circuit 140 includes two resistor-diode voltage divider circuits, as shown in FIG. 2. First resistor-diode voltage divider circuit 172 includes resistor R5, and diodes D5 and D6. Second resistor-diode voltage divider circuit 174 includes resistor R6 and diode D4. Enable comparator circuit 140 also includes comparator amplifier A2. Resistor-diode circuits 172 and 174, and comparator A2, are powered by supply voltage Vdd.

First resistor-diode voltage divider circuit 172 outputs voltage V1, which is received by inverting input node 176 of comparator A2. Second resistor-diode voltage divider circuit 174 outputs voltage V2, which is received by non-inverting input node 178 of comparator A2. As the voltage level of supply voltage Vdd increases from zero volts, the voltage level of voltage signal V1 is equal to the voltage level of supply voltage level Vdd because the voltage across diodes D5 and D6 is not large enough to forward bias D5 and D6, which prevents any current from flowing. As supply voltage Vdd exceeds twice the diode "on" voltage Vd of diodes D5 and D6, current begins to flow through D5 and D6 and V1 becomes clamped at V1=2*Vd.

As supply voltage level Vdd increases from zero volts, the voltage level of voltage signal V2 remains at zero volts until supply voltage level Vdd exceeds the diode "on" voltage level Vd of diode D4. At this point voltage signal V2 becomes V2=Vdd−Vd. When supply voltage level Vdd reaches the voltage level where V2 is greater than V1, comparator A2 is triggered and enable signal Ven output from node 142 transitions from a LO state to a HI state, as shown in FIG. 3. The supply voltage level where enable signal Ven transitions from a LO state to a HI state is second predetermined supply voltage level Ventrig. Thus second predetermined supply voltage level Ventrig is the voltage level of supply voltage level Vdd at which V2 becomes greater than V1.

In circuit 110 according to the invention, the resistance values of resistors R5 and R6 are chosen such that second predetermined voltage level Ventrig is greater than third predetermined voltage level Vrefon, and less than first predetermined voltage level Vtrig. Enable signal Ven is in a LO state, at zero volts, until the voltage level of supply voltage Vdd rises above both third predetermined supply voltage level Vrefon and second predetermined supply voltage level Ventrig. Once the voltage level of supply voltage Vdd is equal to or greater than second predetermined supply voltage level Ventrig, enable signal Ven rises to its HI state—a voltage level proportional to the voltage level of supply voltage Vdd. This behavior of enable signal Ven is shown in trace 156 in FIG. 3. Since enable signal Ven is coupled to reset node 138 of flip-flop 112, enable signal Ven controls the resetting of flip-flop circuit 112. When enable signal Ven is in a LO state, which in this embodiment as at zero volts, flip-flop circuit 112 is held in reset mode. When flip-flop-circuit 112 is in reset mode, power-on reset signal Vpor provided from Q output node 144 is held in a LO state, in this embodiment at zero volts. Enable signal Ven holds flip-flop circuit 112 in reset mode, with power-on reset signal Vpor in a LO state, when enable signal Ven is in a LO state. Enable signal Ven holds flip-flop circuit 112 in reset mode, with power-on reset signal Vpor in a LO state, when the voltage level of supply voltage Vdd is less than second predetermined supply voltage level Ventrig.

Once the voltage level of supply voltage Vdd is greater than second predetermined supply voltage level Ventrig, enable signal Ven is in a HI state. When enable signal Ven is in a HI state, flip-flop circuit 112 is no longer held in reset mode, which allows the Q and not-Q outputs of flip-flop circuit to be controlled by flip-flop circuit D input node 132 and flip-flop circuit clock input 118. In this embodiment, D input node 132 is coupled to supply voltage Vdd. Thus, when enable signal Ven is in a HI state, Q output node 144 outputs power-on reset signal Vpor with a level that tracks the voltage level of clock signal Vclock. When enable signal Ven is in a HI state, and clock signal Vclock is in a LO state, power-on reset signal Vpor is in a LO state. When enable signal Ven is in a HI state, and clock signal Vclock is also in a HI state, power-on reset signal Vpor is in a HI state. This behavior of enable signal Ven is shown in FIG. 3 as curve 156.

It is to be understood that the specific schematic embodiment of circuit 110 shown in FIG. 2 is one example of the disclosed circuit 110 according to the invention. Many other specific embodiments are possible. Circuit 110 according to the invention can use many different types of electronic components, discrete or integrated, different elements, and many different forms of interconnections to form circuit 110 according to the invention.

In the schematic embodiment shown in FIG. 2, enable signal Ven is also received by transistors M11 and M10 of clock comparator circuit 114. In this way enable signal Ven is used to enable clock comparator circuit 114.

Signal traces 152 through 162 of FIG. 3 illustrate how circuit 110 according to the invention provides a reset signal Vpor that indicates when and whether the voltage value of supply voltage Vdd has reached first predetermined supply voltage level Vtrig, where first predetermined supply voltage level Vtrig is the voltage level of supply voltage Vdd that triggers reset signal Vpor to transition from one state to another. Curves 152 through 162 show the behavior of circuit 110 signals as the voltage level of supply voltage Vdd increases in voltage value due to a power-on sequence, a reset, or any other event that requires supply voltage Vdd to rise from its minimum or 'off' voltage level of zero volts to its maximum voltage level Vdd(max). Circuit 110 in the embodiment shown in FIG. 1, FIG. 2, and FIG. 3 indicates when supply voltage reaches first predetermined supply voltage level Vtrig by transitioning from a LO state, in this case zero volts, to a HI state, in this case the voltage level of supply voltage Vdd.

It is to be understood that these particular state transitions are examples only. In some embodiments of circuit 110 according to the invention, Vpor indicates when supply voltage Vdd has reached first predetermined supply voltage level Vtrig by transitioning from a HI state to a LO state. Many different transitions, signal states, and voltage levels can be used by circuit 110 according to the invention to indicate that supply voltage Vdd has reached first predetermined supply voltage level Vtrig. In some embodiments, for example, the not-Q output node 145 of flip-flop 112 is used to provide reset signal Vpor.

Circuit 110 in the embodiment shown in FIG. 1, FIG. 2, and FIG. 3 executes signal transitions at three different predetermined supply voltage Vdd levels, as discussed previously. The first predetermined supply voltage Vdd level is trigger voltage level Vtrig, which is the voltage level of supply voltage Vdd which triggers reset signal Vpor to transition from a LO state to a HI state, as shown by curve 162 in FIG. 3. Reset signal Vpor transitions from a LO state to a HI state in response to clock signal Vclock transitioning from a LO state to HI state, as shown in FIG. 3. In circuit 110 according to the invention, power-on reset signal Vpor is in a LO state when supply voltage Vdd is at a voltage level that is less than first predetermined supply voltage level Vtrig. In circuit 110 according to the invention, power-on reset signal Vpor is in a HI state when supply voltage Vdd is at a voltage level that is greater than or equal to first predetermined supply voltage level Vtrig.

When supply voltage Vdd reaches a voltage level equal to first predetermined supply voltage level Vtrig, divided voltage signal Vdiv becomes greater than bandgap voltage level Vbg, which is the voltage level of reference voltage signal Vref. When the voltage level of divided voltage signal Vdiv rises above the voltage level of reference voltage signal Vref, clock signal Vclock of clock comparator circuit 114 transitions from a LO state to a HI state, as shown in FIG. 3. Clock signal Vclock transitioning from a LO state to a HI state causes reset signal Vpor to transition from a LO state to a HI state, as long as enable signal Ven is not holding flip-flop circuit 112 in reset mode.

Circuit 110 according to the invention uses enable signal Ven to hold flip-flop circuit 112 in reset mode when supply voltage Vdd is within supply voltage level range B as shown in FIG. 3. Supply voltage level Vdd range B is the range of voltage levels of supply voltage Vdd between zero volts and third predetermined supply voltage level Vrefon. Vrefon is the voltage level at which enable comparator circuit 140 becomes stable and outputs voltage reference signal Vref equal to bandgap voltage level Vbg, as shown in FIG. 3. When the voltage level of supply voltage Vdd is less than third predetermined supply voltage level Vrefon, clock comparator circuit 114 and bandgap reference voltage circuit 122 may be unstable, and clock signal Vclock may transition undesirably. Circuit 110 according to the invention uses enable signal Ven to hold flip-flop circuit 112 in reset mode when supply voltage Vdd is at a voltage level less than third predetermined supply voltage level Vrefon, so that no matter what clock signal Vclock does in this range—range B of supply voltage Vdd—reset signal Vpor stays in a LO state. In the embodiment of circuit 110 shown in FIG. 1, FIG. 2, and FIG. 4, holding flip-flop circuit 112 in reset mode means providing enable signal Ven to reset node 138 of flip-flop 112.

Circuit 110 transitions enable signal Ven from a LO state to a HI state when the voltage level of supply voltage Vdd becomes greater than or equal to second predetermined supply voltage level Ventrig. Second predetermined supply voltage level Ventrig is a voltage level less than first predetermined supply voltage level Vtrig, and greater than or equal to third predetermined supply voltage level Vrefon. Second predetermined supply voltage level Ventrig is a voltage level less than first predetermined supply voltage level Vtrig so that flip-flop circuit 112 is not held in reset mode when the voltage level of supply voltage Vdd reaches first predetermined supply voltage level Vtrig. Second predetermined supply voltage level Ventrig is designed to be greater than or equal to third predetermined supply voltage level Vrefon, so that flip-flop circuit 112 is held in reset mode when the voltage level of supply voltage Vdd is in a range where reference signal Vref and clock signal Vclock are unstable. Thus second predetermined supply voltage level Ventrig in circuit 110 according to the invention is greater than or equal to third predetermined voltage level Vrefon, and less than first predetermined supply voltage level Vtrig.

Disclosed is circuit 110 according to the invention, where circuit 110 outputs power-on reset signal Vpor. Reset signal Vpor can be used to indicate when or whether the voltage level of a supply voltage Vdd has risen above first predetermined supply voltage level Vtrig. Reset signal Vpor indicates when the voltage level of supply voltage Vdd has risen above first predetermined supply voltage level Vtrig by transitioning signal state. In the disclosed embodiments of circuit 110, reset signal Vpor transitions from a LO state to a HI state to indicate when the voltage level of a supply voltage Vdd has risen above first predetermined supply voltage level Vtrig. In some embodiments reset signal Vpor transitions from a HI state to a LO state to indicate when the voltage level of a supply voltage Vdd has risen above first predetermined supply voltage level Vtrig. First predetermined supply voltage level Vtrig can be set to be very close to the maximum supply voltage level Vdd(max), without resulting in false or undesirable reset signal Vpor transitions if the voltage level of supply voltage Vdd dips, glitches, or fluctuates. First predetermined supply voltage level Vtrig will not vary due to temperature or process variations of circuit 110. Reset signal Vpor will not transition unless the voltage level of supply voltage Vdd falls below a second predetermined supply voltage level Ventrig, where Ventrig is a voltage level less than first predetermined supply voltage level Vtrig. Reset signal Vpor is held in a LO state by enable signal Ven until the voltage level of supply voltage Vdd rises above third predetermined supply voltage level Vrefon, because at levels of supply voltage Vdd less than third predetermined supply voltage level Vrefon, portions of circuit 110 are unstable and could cause undesirable reset signal Vpor transitions if enable signal Ven is not holding reset signal Vpor in a LO state at these low levels of supply voltage Vdd. Reset signal Vpor is held in a LO state by enable signal Ven until the voltage level of supply voltage Vdd rises above second predetermined supply voltage level Ventrig, where Ventrig is a voltage level greater than third predetermined supply voltage level Vrefon.

Figure 5:
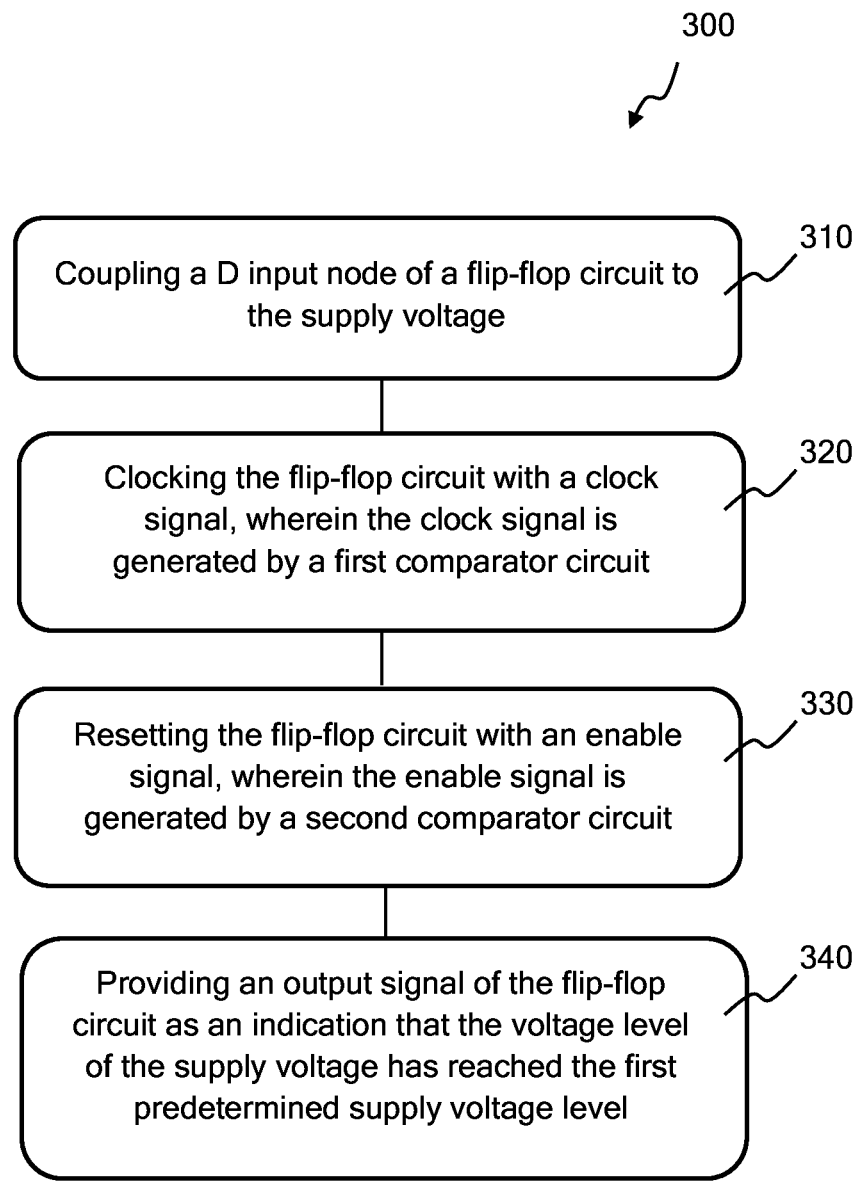
FIG. 5 illustrates method 300 according to the invention of indicating that a voltage level of a supply voltage has reached a first predetermined supply voltage level.

FIG. 5 shows method 300 according to the invention of indicating that a voltage level of a supply voltage has reached a first predetermined supply voltage level. Method 300 according to the invention includes step 310 of coupling a D input node of a flip-flop circuit to the supply voltage, and step 320 of clocking the flip-flop circuit with a clock signal, where the clock signal is generated by a first comparator circuit. Method 300 according to the invention also includes step 330 resetting the flip-flop circuit with an enable signal, where the enable signal is generated by a second comparator circuit, and step 340 providing an output signal of the flip-flop circuit as an indication that the voltage level of the supply voltage has reached the first predetermined supply voltage level. Method 300 can include many other steps. In some embodiments of method 300 the first comparator circuit is enabled by the enable signal. In some embodiments the output signal provided from a Q output node of the flip-flop circuit is used to indicate that the voltage level of the supply voltage has reached the first predetermined supply voltage level.

In some embodiments of method 300 according to the invention, step 330 resetting the flip-flop circuit with an enable signal includes the step of maintaining an enable signal in a LO state if the voltage level of the supply voltage is less than a second predetermined supply voltage level, where an output signal provided from a Q output node of the flip-flop circuit is in a LO state when the enable signal is in a LO state, and where the second predetermined supply voltage level is less than the first predetermined supply voltage level. In some embodiments of method 300 according to the invention, step 330 resetting the flip-flop circuit with an enable signal includes the step of providing the enable signal to a reset node of the flip-flop circuit.

In some embodiments of method 300 according to the invention, step 320 clocking the flip-flop circuit with a clock signal includes the step of maintaining a clock signal in a LO state if the voltage level of the supply voltage is within a range of voltage levels that varies from a third predetermined supply voltage level to the first predetermined supply voltage level, where an output signal provided from a Q output node of the flip-flop circuit is in a LO state when the clock signal is in a LO state, and where the third predetermined supply voltage level is less than the second predetermined supply voltage level. In some embodiments of method 300 according to the invention, step 320 clocking the flip-flop circuit with a clock signal includes the step of providing the clock signal to a clock input node of the flip-flop circuit.

Figure 6:
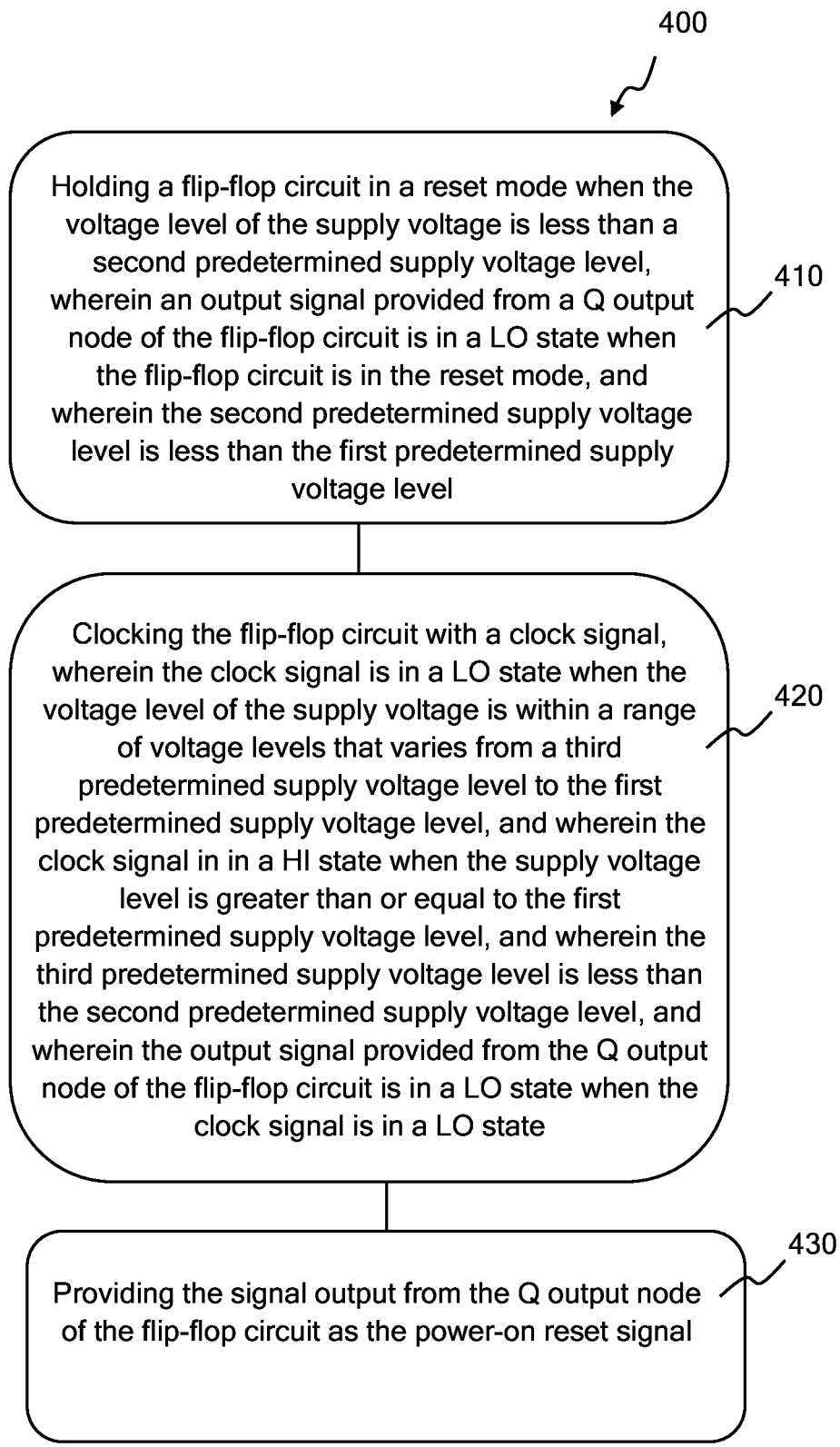
FIG. 6 illustrates method 400 according to the invention of providing a power-on reset signal, where the power-on reset signal indicates when a voltage level of a supply voltage has reached a first predetermined supply voltage level.

FIG. 6 shows method 400 of providing a power-on reset signal, wherein the power-on reset signal indicates when a voltage level of a supply voltage has reached a first predetermined supply voltage level. Method 400 according to the invention includes step 410 of holding a flip-flop circuit in a reset mode when the voltage level of the supply voltage is less than a second predetermined supply voltage level, where an output signal provided from a Q output node of the flip-flop circuit is in a LO state when the flip-flop circuit is in the reset mode, and where the second predetermined supply voltage level is less than the first predetermined supply voltage level. Method 400 according to the invention includes step 420 of clocking the flip-flop circuit with a clock signal, where the clock signal is in a LO state when the voltage level of the supply voltage is within a range of voltage levels that varies from a third predetermined supply voltage level to the first predetermined supply voltage level, and where the clock signal is in a HI state when the supply voltage level is greater than or equal to the first predetermined supply voltage level, and where the third predetermined supply voltage level is less than the second predetermined supply voltage level, and where the output signal provided from the Q output node of the flip-flop circuit is in a LO state when the clock signal is in a LO state.

Method 400 according to the invention also includes step 430 of providing the signal output from the Q output node of the flip-flop circuit as the power-on reset signal.

In some embodiments of method 400 according to the invention, step 420 clocking the flip-flop circuit with a clock signal includes the step of generating a clock signal with a first comparator circuit. In some embodiments of method 400 according to the invention, step 420 clocking the flip-flop circuit with a clock signal includes the step of providing the clock signal to a clock input node of the flip-flop circuit.

In some embodiments of method 400 according to the invention generating a clock signal with a first comparator circuit includes the step of providing a divided voltage signal to a non-inverting input node of the first comparator circuit, where the voltage level of the divided voltage signal varies proportionally to the voltage level of the supply voltage. In some embodiments of method 400 according to the invention, generating a clock signal with a first comparator circuit includes the step of providing a bandgap reference voltage to an inverting input node of the first comparator circuit; where the voltage level of the divided voltage signal is less than the voltage level of the bandgap reference voltage when the voltage level of the supply voltage is within a range of supply voltage levels that varies from a third predetermined supply voltage level to the first predetermined supply voltage level, and where the voltage level of the divided voltage signal is greater than the voltage level of the bandgap reference voltage when the voltage level of the supply voltage is greater than or equal to the first predetermined supply voltage level. In some embodiments of method 400 according to the invention, generating a clock signal with a first comparator circuit includes the step of using an output signal from the clock comparator circuit as a clock signal.

In some embodiments of method 400 according to the invention, step 410 holding a flip-flop circuit in a reset mode when the voltage level of the supply voltage is less than a second predetermined supply voltage level includes the step of generating an enable signal with a second comparator circuit, where the enable signal is in a LO state when the voltage level of the supply voltage is less than a second predetermined supply voltage level, and where the enable signal is in a HI state when the voltage level of the supply voltage is greater than or equal to the second predetermined supply voltage level. In some embodiments of method 400 according to the invention, step 410 holding a flip-flop circuit in a reset mode when the voltage level of the supply voltage is less than a second predetermined supply voltage level includes the step of providing the enable signal to a reset node of the flip-flop circuit, where the flip-flop circuit is in the reset mode when the enable signal is in a LO state.

The embodiments and examples set forth herein were presented in order to best explain the present invention and its practical application and to thereby enable those of ordinary skill in the art to make and use the invention. However, those of ordinary skill in the art will recognize that the foregoing description and examples have been presented for the purposes of illustration and example only. The description as set forth is not intended to be exhaustive or to limit the invention to the precise form disclosed. Many modifications and variations are possible in light of the teachings above.

The invention claimed is:

1. An electronic circuit for generating a reset signal, the electronic circuit comprising:
   a flip-flop circuit powered by a supply voltage, wherein the flip-flop circuit generates the reset signal in response to a voltage level of the supply voltage being equal to or greater than a first predetermined supply voltage level;
   a clock comparator circuit, wherein the clock comparator circuit outputs a clock signal; and
   an enable comparator circuit directly connected to the clock comparator circuit and the flip-flop circuit, wherein the enable comparator circuit outputs an enable signal;
   wherein:
      the flip-flop circuit is clocked by the clock signal;
      the clock comparator circuit is enabled by the enable signal;
      the flip-flop circuit is reset by the enable signal; and
      the enable signal is in a LO state when the supply voltage is at a voltage level that is less than a second predetermined supply voltage level, and wherein the enable signal is in a HI state when the supply voltage is at a voltage level that is greater than or equal to the second predetermined supply voltage level, and wherein the second predetermined supply voltage level is less than the first predetermined supply voltage level.

2. The electronic circuit of claim 1, wherein the clock signal is in a LO state when the supply voltage level is at a voltage level that is both greater than a third predetermined supply voltage level and less than the first predetermined supply voltage level, wherein the third predetermined supply voltage level is less than the second predetermined supply voltage level.

3. The electronic circuit of claim 1, wherein a D input node of the flip-flop circuit is coupled to a supply voltage.

4. The electronic circuit of claim 1, wherein a Q output node of the flip-flop circuit outputs the reset signal.

5. The electronic circuit of claim 1, wherein the clock comparator circuit receives power from the supply voltage.

6. The electronic circuit of claim 1, wherein the enable comparator circuit receives power from the supply voltage.

7. An electronic circuit powered by a supply voltage, the electronic circuit comprising:
   a flip-flop circuit, wherein the flip-flop circuit generates a power-on reset signal, and wherein the power-on reset signal indicates whether the supply voltage is greater than or equal to a first predetermined supply voltage level;
   a first comparator circuit, wherein the first comparator circuit outputs a clock signal, and where the flip-flop circuit is clocked by the clock signal; and
   a second comparator circuit directly connected to the first comparator circuit and the flip-flop circuit, wherein the second comparator circuit outputs an enable signal, and wherein the enable signal holds the flip-flop circuit in a reset mode when the voltage level of the supply voltage is less than a second predetermined supply voltage level, and where the second predetermined supply voltage level is less than the first predetermined supply voltage level.

8. The electronic circuit of claim 7, wherein the clock signal is in a LO state when the supply voltage level is at a voltage level that is both greater than a third predetermined supply voltage level, and less than the first predetermined supply voltage level, wherein the third predetermined supply voltage level is less than the second predetermined supply voltage level.

9. The electronic circuit of claim 7, wherein the enable signal enables the first comparator circuit.

10. A method of indicating that a voltage level of a supply voltage has reached a first predetermined supply voltage level, the method comprising the steps of:
   generating in a comparator circuit an enable signal, wherein the enable signal is in a LO state when the voltage level of the supply voltage is less than a second predetermined supply voltage level, and where the second predetermined supply voltage level is less than the first predetermined supply voltage level;
   providing the enable signal directly to a flip-flop circuit and a clock comparator circuit;
   resetting the flip-flop circuit with the enable signal;
   clocking the flip-flop circuit with a clock signal provided by the clock comparator circuit, wherein the clock signal is in a HI state when the supply voltage level is greater than or equal to the first predetermined supply voltage level; and
   providing an output signal of the flip-flop circuit as an indication that the voltage level of the supply voltage has reached the first predetermined supply voltage level.

11. The method of claim 10, wherein the clock signal is in a LO state when the voltage level of the supply voltage is within a range of supply voltage levels that varies from a third predetermined supply voltage level to the first predetermined supply voltage level, wherein the third predetermined supply voltage level is less than the second predetermined supply voltage level.

12. The method of claim 10, further comprising the step of coupling a D input node of the flip-flop circuit to the supply voltage.

13. The method of claim 10, wherein the step of providing an output signal of the flip-flop circuit as an indication that the voltage level of the supply voltage has reached the first predetermined supply voltage level comprises providing an output signal from a Q output node of the flip-flop circuit as an indication that the voltage level of the supply voltage has reach the first predetermined supply voltage level.

14. A method of providing a power-on reset signal from an output node of a flip-flop circuit, wherein the power-on reset signal indicates when a voltage level of a supply voltage has reached a first predetermined supply voltage level, the method comprising the steps of:

generating an enable signal in a comparator circuit, the enable signal indicative of a voltage level of the supply voltage;

providing the enable signal directly to the flip-flop circuit and a clock comparator circuit;

holding the flip-flop circuit in a reset mode when the enable signal indicates that the voltage level of the supply voltage is less than a second predetermined supply voltage level, wherein the second predetermined supply voltage level is less than the first predetermined supply voltage level; and clocking the flip-flop circuit with a clock signal provided by the clock comparator circuit, wherein the clock signal is in a LO state when the voltage level of the supply voltage is within a range of voltage levels that varies from a third predetermined supply voltage level to the first predetermined supply voltage level, and wherein the third predetermined supply voltage level is less than the second predetermined supply voltage level.

15. The method of claim 14, further comprising the step of providing a signal from an output node of the flip-flop circuit as the power-on reset signal.

16. The method of claim 14, further comprising the step of providing a signal from a Q output node of the flip-flop circuit as the power-on reset signal.

17. The method of claim 16, wherein the power-on reset signal is in a LO state when the flip-flop circuit is in the reset mode.

18. The method of claim 17, wherein the power-on reset signal is in a LO state when the clock signal is in a LO state.

19. The method of claim 14, wherein the clock signal is in a HI state when the supply voltage level is greater than or equal to the first predetermined supply voltage level.

* * * * *